United States Patent [19]

Murakami et al.

[11] Patent Number: 5,480,675
[45] Date of Patent: Jan. 2, 1996

[54] METHOD OF AND APPARATUS FOR PLATING PRINTED CIRCUIT BOARD

[75] Inventors: Tomoo Murakami; Hidebumi Ohnuki; Takanori Tsunoda; Ryo Maniwa, all of Tokyo, Japan

[73] Assignee: NEC Corporation, Japan

[21] Appl. No.: 209,606

[22] Filed: Mar. 10, 1994

Related U.S. Application Data

[63] Continuation of Ser. No. 978,983, Nov. 19, 1992, abandoned.

[30] Foreign Application Priority Data

Nov. 20, 1991 [JP] Japan .................... 3-303691

[51] Int. Cl.⁶ ........................................ B05D 5/12
[52] U.S. Cl. .................. 427/98; 427/97; 427/294; 427/305; 427/443.1
[58] Field of Search ................ 427/97, 98, 294, 427/443.1, 305; 118/404, 425

[56] References Cited

U.S. PATENT DOCUMENTS

| | | | |
|---|---|---|---|
| 3,436,819 | 4/1969 | Lunine | 427/98 |
| 3,934,054 | 1/1976 | Schmeling | 427/437 |
| 4,477,484 | 10/1984 | Paoletti | 427/98 |
| 4,622,917 | 11/1986 | Schramm | 427/97 |
| 4,734,296 | 3/1988 | Schramm | 427/98 |
| 4,938,853 | 7/1990 | Retallick | 427/98 |
| 5,077,099 | 12/1991 | Kukanskis | 118/425 |

FOREIGN PATENT DOCUMENTS

| | | | |
|---|---|---|---|
| 1012877 | 1/1986 | Japan . | |
| 23697 | 1/1990 | Japan . | |
| 3050891 | 3/1991 | Japan | 427/98 |

OTHER PUBLICATIONS

English translation of Japanese Patent No. 12877.

Joseph J. D'Ambrisis et al "The Chemistry of Plating Small Diameter Holes—Part I", Apr., 1989 PC FAB.

Joseph J. D'Ambrisis et al "The Chemistry of Plating Small Diameter Holes—Part II", Aug. 1989 PC FAB.

*Primary Examiner*—Shrive Beck
*Assistant Examiner*—David M. Maiorana
*Attorney, Agent, or Firm*—Laff, Whitesel, Conte & Saret, Ltd.

[57] ABSTRACT

An apparatus for plating a printed circuit board including a non-through hole for connecting between a surface conductive layer and an interlayer wiring layer has a jig, a vessel, a supporting body carrying the jig for causing it to vibrate and swing in a plating liquid contained in the vessel, and a vacuum pump connected to the vessel for exhausting the air in the vessel thereby enhancing removal of bubbles in the non-through hole. A method of plating a printed circuit board includes the step of reducing the pressure inside the vessel simultaneously with the printed circuit board being subjected to the vibration and swinging actions thereby to remove a bubble existing inside the non-through hole. The removal of the bubble makes it possible to have a uniform plating film formed in an inner wall of the non-through hole and ensures the reliable electric connection to be established through the non-through hole between a surface conductive layer and interlayer conductive layers.

9 Claims, 3 Drawing Sheets

5,480,675

METHOD OF AND APPARATUS FOR PLATING PRINTED CIRCUIT BOARD

This application is a continuation of application Ser. No. 07/978,983, filed Nov. 19, 1992 now abandoned.

BACKGROUND OF THE INVENTION (1) Field of the Invention

The present invention relates to a method of and apparatus for plating a board or plate, and more particularly to a method of and apparatus for plating a printed circuit board.

(2) Description of the Related Art

Generally, in a conventional method for plating a board or plate, a metal film or layer is formed on a surface of an insulating material by a non-electrolytic plating process for establishing conductivity in the material. A conventional method for plating a board such as a printed circuit board employs a procedure wherein a through hole is formed at an appropriate location in a surface of a copper plated epoxy resin laminated board and a catalytic liquid is caused to be absorbed in an inner wall of the through hole, followed by a non-electrolytic copper plating process for copper-plating the overall surface including a surface of the inner wall of the through hole. In this case, through the through hole thus formed, the electrical connection is established between a front and a back side of the copper plated laminate board. Where a multi-layer wiring board is provided with a non-through hole, similarly a metal film is formed in an inner wall of the non-through hole whereby the interconnection between the metal film on the surface and the inner wiring layer(s) of the multi-layer wiring board is established.

In a conventional non-electrolytic copper plating method, a process for removing bubbles in a vessel in which an inner wall of a through hole or a non-through hole is plated widely uses a combination of swinging and vibration processes.

FIG. 1 is a schematic sectional view of a plating device for describing a conventional method for plating a printed circuit board.

As shown in FIG. 1, a jig 2 carrying a printed circuit board 6 is attached to a supporting body 3 which is connected to a vibration and swing oscillator. The supporting body 3 is caused to be vibrated and swung in a state in which the jig 2 hangs from the supporting body 3 and is immersed in a plating liquid 7 within the vessel 1. Consequently, the bubbles attached to a surface of the printed circuit board 6 or to an inside wall of the through hole or the non-through hole provided in the printed circuit board are removed or expelled and thereafter the plating of a conductive film thereon is effected.

In the conventional method for plating a printed circuit board as described above, as shown in FIGS. 2A and 2B, a part of the bubble existing in the non-through hole is removed due to the vibration and swinging actions but, because of the pressure from the plating liquid 7, the remaining portion of the bubble under pressure in the non-through hole remains in place. This causes problems that an unevenly plated film or incompletely plated film results and that interlayer wirings to be connected to the surface metal layer through the metal film formed inside the non-through hole inevitably become unstable.

Furthermore, in the case where, in order to cope with high density wirings, the diameter of the non-through hole is made small thereby increasing a ratio, i.e., an aspect ratio, between the depth and the diameter of the non-through hole, it becomes impossible to form the plating film inside the non-through hole, in which case the connection between the interlayer wiring layers and the metal films on the surfaces cannot be established.

The above problems or defects in the conventional plating method are to be solved by the present invention.

SUMMARY OF THE INVENTION

It is, therefore, an object of the invention to overcome the problems existing in the conventional plating method and to provide an improved plating method by which removal of a bubble existing inside the non-through hole can be effected easily.

According to one aspect of the invention, there is provided a method for plating a printed circuit board in which a printed circuit board including a non-through hole for connecting a surface conductive layer and an interlayer wiring layer is immersed in a plating liquid in a vessel and is subjected to vibration and swinging actions, the method comprising the step of reducing the pressure inside the vessel simultaneously with the printed circuit board being subjected to the vibration and swinging actions thereby to remove a bubble existing inside the non-through hole.

According to another aspect of the invention, there is also provided an apparatus for plating a printed circuit board including a non-through hole for connecting between a surface conductive layer and an interlayer wiring layer, comprising:

a jig for holding the printed circuit board;

a vessel enclosing the jig;

a supporting body which carries the jig and which causes the jig to vibrate and swing in a plating liquid contained in the vessel;

an exhaust pipe connected to the vessel; and a vacuum pump which is connected to the exhaust pipe and which is for exhausting an air in the vessel thereby enhancing removal of a bubble in the non-through hole.

PREFERRED EMBODIMENTS OF THE INVENTION

Figure 1:
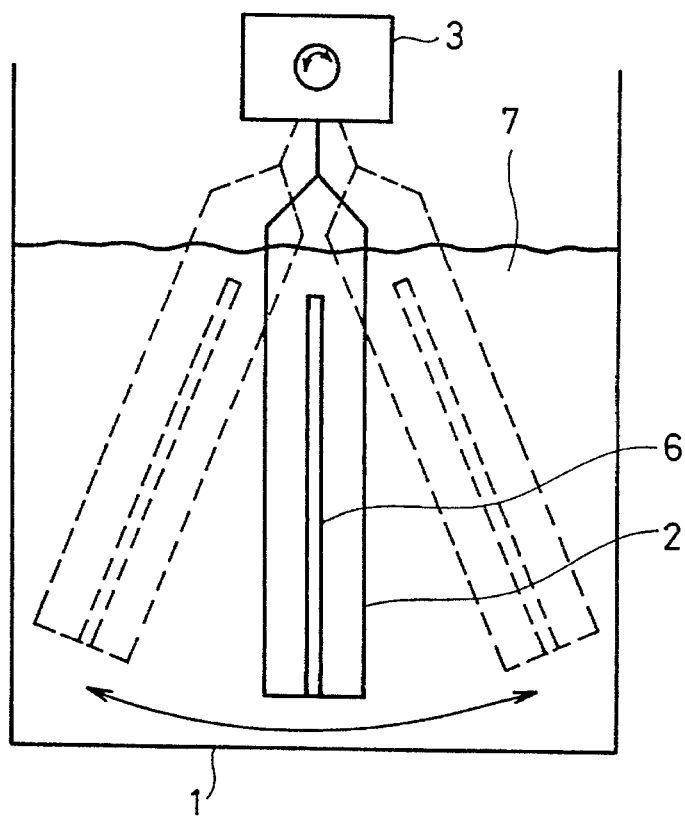
FIG. 1 is a schematic sectional view of a plating device for explaining a conventional method for plating a printed circuit board.
Figure 2A:
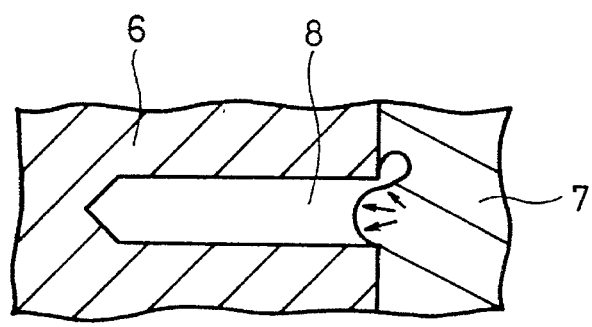
FIGS. 2A and 2B are schematic enlarged partial sectional views of printed circuit boards for explaining problems in the conventional method for plating a printed circuit board.
Figure 2B:
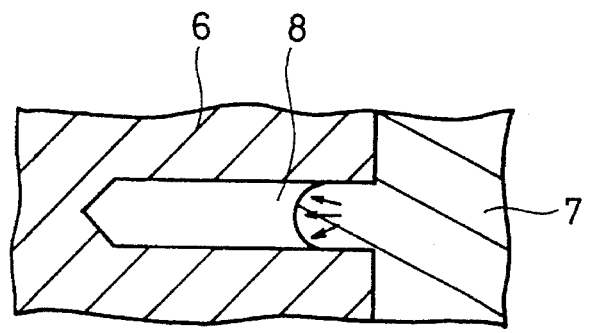

Now, preferred embodiments of the present invention will be explained with reference to the accompanying drawings. It is to be noted that, throughout the following explanation, the same reference numerals refer to the same or like elements in all the figures of the drawings.

Figure 3:
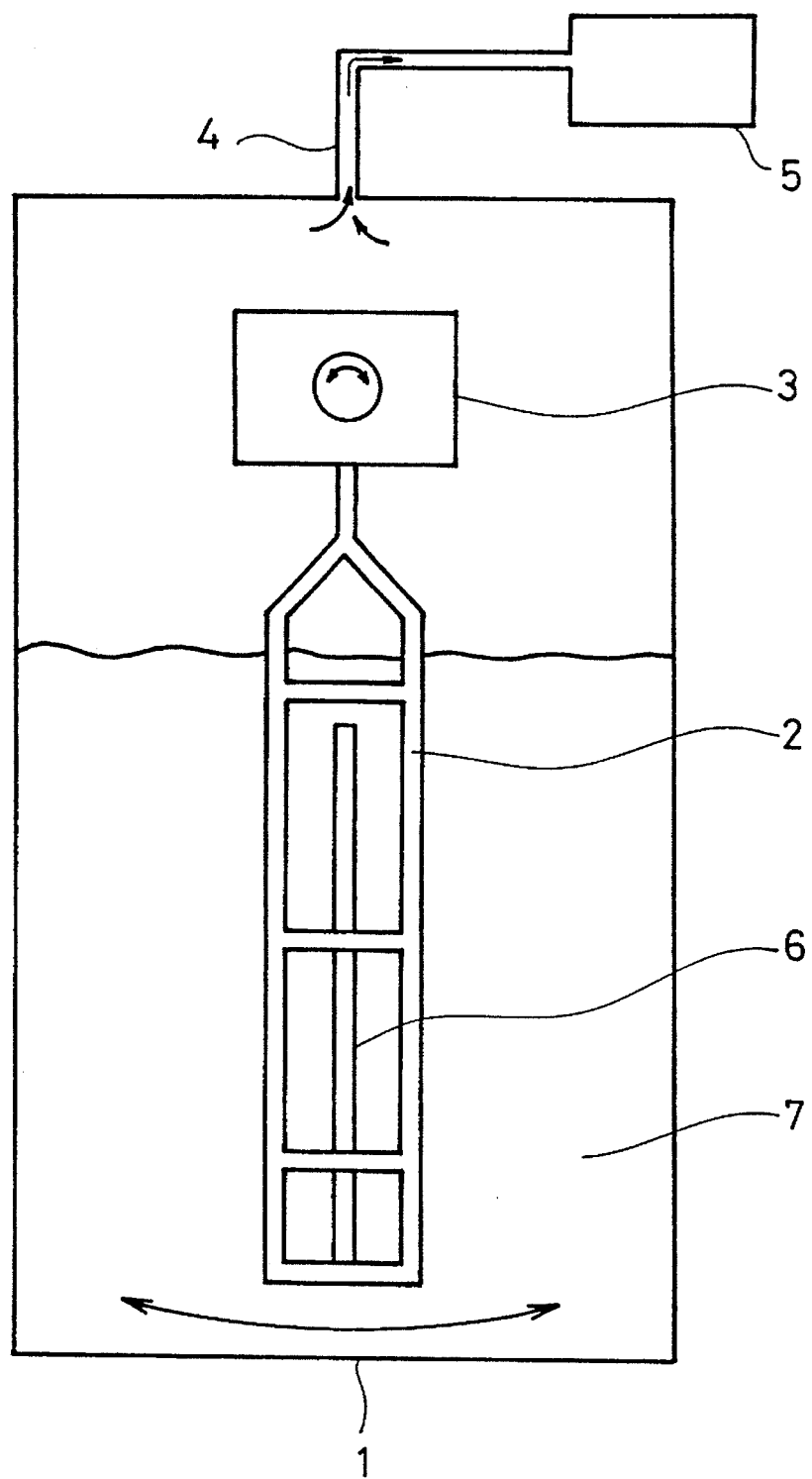
FIG. 3 is a schematic sectional view of a plating device for explaining a first embodiment of a method for plating a printed circuit board according to the present invention.

FIG. 3 shows, in a schematic sectional view, a plating device of a first embodiment according to the present invention.

As shown in FIG. 3, the plating device includes a supporting body 3 and a vacuum pump 5. The supporting body 3 is provided at an inner top portion of a sealable vessel 1, carries a plating jig 2 and is connected to a vibration and swing oscillation device (not shown in the drawings) for vibrating and swinging the jig 2. The vacuum pump 5 is connected to an exhaust pipe 4 provided at a top of the vessel 1 for exhausting the air inside the vessel. The printed circuit board 6 is placed in the jig 2 of the plating device and is immersed in the plating liquid 7 in the vessel 1. Next, the supporting body 3 is driven by the vibration and swing oscillation device in the state in which the vessel 1 is sealed and the pressure is reduced to 30 Torr by the operation of the vacuum pump 5. The jig 2 is swung, for example, sixteen times per minute in the directions shown in arrows in FIG. 3 and, at the same time, is vibrated 30 Hz while the non-electrolytic copper plating process on the printed circuit board is carried out.

Figure 4A:
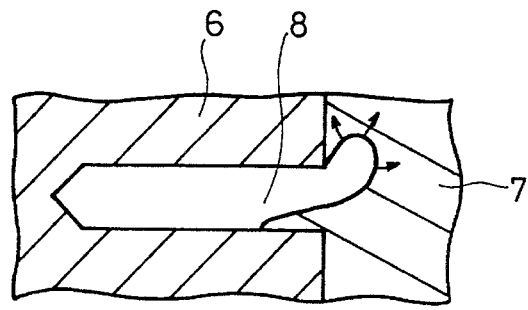
FIGS. 4A and 4B are schematic enlarged partial sectional views of printed circuit boards for explaining the first embodiment of the method for plating a printed circuit board according to the present invention.
Figure 4B:
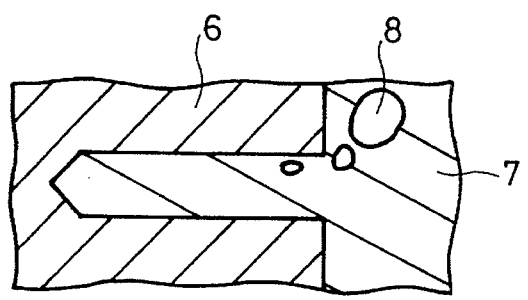

As shown in FIGS. 4A and 4B, from the non-through hole of the printed circuit board 6 having the aspect ratio of 2~3 with the hole diameter being 0.2 mm and the hole depth being 0.4~0.6 mm, the bubble 8 remaining in the non-through hole moves out in exchange of the plating liquid 7 moving in as the pressure is reduced in the vessel 1 and this ensures the formation of a satisfactory plating film inside the non-through hole.

Figure 5:
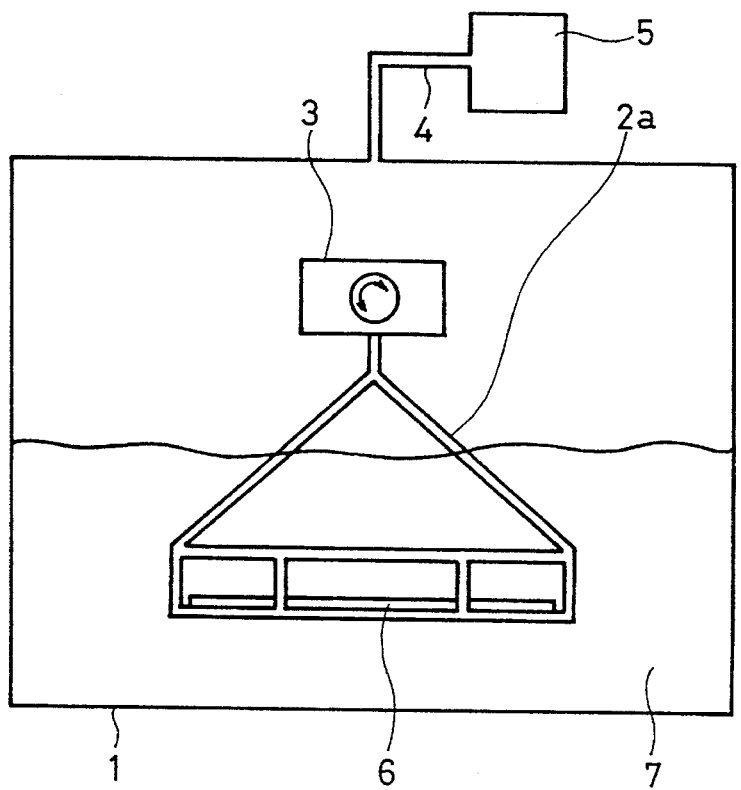
FIG. 5 is a schematic sectional view of a plating device for explaining a section embodiment of a method for plating a printed circuit board according to the present invention.

FIG. 5 shows, in a schematic sectional view, a plating device of a second embodiment according to the invention. The FIG. 5 arrangement is the same as that of the first embodiment except that the jig 2a is of a lateral type. Since the printed circuit board 6 can be placed in the jig 2a with the opening of the non-through hole being directed upwardly, the bubble 8 inside the non-through hole can be easily and readily removed.

As explained above, according to the present invention, since the pressure in the vessel is reduced to remove bubbles in the non-through hole, simultaneously with the circuit board being subjected to the vibration and swinging actions, thereby making it easy for the plating liquid to enter into the non-through hole, it is possible to have a uniform plating film formed in an inner wall of the non-through hole having a large aspect ratio. This enhances the reliable electric connection to be established through the non-through hole between a surface conductive layer and interlayer conductive layers.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for plating a printed circuit board in which the printed circuit board includes both a through hole and a cul-de-sac formed by a non-through hole for connecting a surface conductive layer and an interlayer wiring layer, said printed circuit board being immersed in a plating liquid in a vessel and being simultaneously subjected to both vibration and swinging actions, said method comprising the additional step of reducing the pressure inside the vessel simultaneously with the printed circuit board being subjected to the vibration and swinging actions in order to remove any bubbles existing inside the cul-de-sac formed by said non-through hole, said swinging actions upending said cul-de-sac so that said bubbles float upwardly and out of said cul-de-sac.

2. An apparatus for plating a printed circuit board including a cul-de-sac formed by a non-through hole for making a connection between a surface conductive layer and an interlayer wiring layer, said apparatus comprising:

a swinging jig for holding said printed circuit board;

a vessel enclosing said jig;

a supporting body which carries said jig and which causes said jig to both vibrate and swing in a plating liquid contained in said vessel;

an exhaust pipe connected to said vessel; and a vacuum pump which is connected to said exhaust pipe for exhausting air from said vessel to enhance a removal of any bubble in said cul-de-sac formed by said non-through hole.

3. An apparatus for plating a printed circuit board according to claim 2, in which said jig is vertically arranged for holding therein the printed circuit board in a state in which an opening of the non-through hole is directed upwardly.

4. A method of plating a printed circuit board having at least one dead end cul-de-sac formed by a non-through hole which may appear on either side of said printed circuit board, whereby a gas bubble may become trapped in the dead end cul-de-sac hole, said method comprising the steps of:

suspending said printed circuit card in a vertical position within a plating fluid bath inside a vacuum chamber held at a negative pressure whereby said dead end cul-de-sac hole is in a horizontal position and may have air bubbles entrapped therein;

swinging said suspended printed circuit card so that an open end of said dead end cul-de-sac formed by said non-through hole is repeatedly disposed in an upward position so that said trapped bubble may float upwardly and raise out of said hole; and vibrating said swinging printed circuit board simultaneously with said swinging.

5. The method of claim 4 wherein said negative pressure in said vacuum chamber is in the order of 30 Torr.

6. The method of claim 4 wherein said swinging printed circuit board swings at a rate of approximately sixteen swings per minute.

7. The method of either claim 4 or 6 wherein said vibrations are at a rate of approximately 30 Hz.

8. The method of claim 7 wherein said dead end hole has an aspect ratio in the order of approximately 2 to 3.

9. The method of claim 7 wherein said dead end hole has a diameter in the order of about 0.2 mm and a depth in the order of about 0.4–0.6 mm.

* * * * *